United States Patent
Cook et al.

(10) Patent No.: US 8,398,768 B2
(45) Date of Patent: *Mar. 19, 2013

(54) METHODS OF MAKING AN ARTICLE OF SEMICONDUCTING MATERIAL ON A MOLD COMPRISING SEMICONDUCTING MATERIAL

(75) Inventors: Glen Bennett Cook, Elmira, NY (US); Christopher Scott Thomas, Horseheads, NY (US); Natesan Venkataraman, Painted Post, NY (US)

(73) Assignee: Corning Incorporated, Corning, NY (US)

(*) Notice: Subject to any disclaimer, the term of this patent is extended or adjusted under 35 U.S.C. 154(b) by 675 days.

This patent is subject to a terminal disclaimer.

(21) Appl. No.: 12/466,143

(22) Filed: May 14, 2009

(65) Prior Publication Data

US 2010/0290946 A1 Nov. 18, 2010

(51) Int. Cl.
- C30B 23/00 (2006.01)
- C30B 25/00 (2006.01)
- C30B 28/12 (2006.01)
- C30B 28/14 (2006.01)

(52) U.S. Cl. .......... 117/95; 420/555; 420/556; 420/557; 420/578; 264/104

(58) Field of Classification Search ............... 117/95
See application file for complete search history.

(56) References Cited

U.S. PATENT DOCUMENTS

| | | | | |
|---|---|---|---|---|
| 2,944,321 A | * | 7/1960 | Westberg | 117/53 |
| 3,515,201 A | * | 6/1970 | Zimmerman | 164/66.1 |
| 5,380,372 A | * | 1/1995 | Campe et al. | 136/258 |
| 5,712,119 A | * | 1/1998 | Oppermann et al. | 435/69.4 |
| 6,413,313 B1 | * | 7/2002 | Yoshida et al. | 117/200 |
| 6,596,075 B2 | * | 7/2003 | Igarashi et al. | 117/26 |
| 7,071,489 B2 | * | 7/2006 | Tsukuda | 257/75 |
| 2001/0044163 A1 | | 11/2001 | Tsukuda et al. | 438/22 |
| 2002/0092464 A1 | | 7/2002 | Nakagawa et al. | 117/94 |
| 2003/0013280 A1 | * | 1/2003 | Yamanaka | 117/84 |
| 2003/0140859 A1 | | 7/2003 | Ukiyo et al. | 118/726 |
| 2009/0004835 A1 | | 1/2009 | Drevet et al. | 438/486 |
| 2009/0056805 A1 | * | 3/2009 | Barnett et al. | 136/256 |
| 2010/0290946 A1 | | 11/2010 | Cook et al. | 420/555 |
| 2012/0129293 A1 | * | 5/2012 | Potapenko et al. | 438/89 |
| 2012/0196088 A1 | * | 8/2012 | Mazumder et al. | 428/156 |

FOREIGN PATENT DOCUMENTS

| | | |
|---|---|---|
| EP | 1085559 | 9/2000 |
| EP | 1 113 096 | 7/2001 |
| EP | 2014802 A1 | 1/2009 |
| JP | 57134235 A * | 8/1982 |
| JP | 63272951 A * | 11/1988 |
| WO | 2005/117079 | 12/2005 |
| WO | 2009/108358 | 9/2009 |
| WO | 2010/132651 | 11/2010 |

* cited by examiner

*Primary Examiner* — Kaj K Olsen
*Assistant Examiner* — Ross J Christie
(74) *Attorney, Agent, or Firm* — Michael W. Russell

(57) ABSTRACT

The invention relates to methods of making articles of semiconducting material on a mold comprising semiconducting material and semiconducting material articles formed thereby, such as articles of semiconducting material that may be useful in making photovoltaic cells.

13 Claims, 3 Drawing Sheets

METHODS OF MAKING AN ARTICLE OF SEMICONDUCTING MATERIAL ON A MOLD COMPRISING SEMICONDUCTING MATERIAL

FIELD

The invention relates to methods of making an article of semiconducting material on a mold comprising semiconducting material, and semiconducting material articles formed thereby, such as articles of semiconducting material that may be useful in making photovoltaic cells.

BACKGROUND

Semiconducting materials find uses in many applications. For example, semiconducting materials can be used in electronic devices as processors formed on semiconductor wafers. As a further example, semiconducting materials may also be used to convert solar radiation into electrical energy through the photovoltaic effect.

The semiconducting properties of a semiconducting material may depend on the crystal structure of the material. Dopants, impurities and other defects may affect the resulting properties. Trace amounts of transition metals, oxygen, or carbon, for example, may affect conductivity or carrier lifetime.

The grain size and shape distribution often play an important part in the performance of semiconducting devices. Generally, a larger and more uniform grain size is desirable for semiconducting devices. For example, the electrical conductivity and efficiency of photovoltaic cells may be improved by increasing both the grain size and the uniformity of the grains.

For silicon-based solar photovoltaic cells, the silicon can be formed, for example, as an unsupported ingot, sheet or ribbon, or supported by forming the silicon on a substrate. Conventional methods for making unsupported and supported articles of semiconducting materials, such as silicon sheets, have several shortcomings.

Methods of making unsupported, i.e., without an integral substrate, thin semiconducting material sheets may be slow or wasteful of the semiconducting material feedstock. Methods by which unsupported single crystalline semiconducting materials are made include, for example, the Czochralski process, which may lead to significant kerf loss when the material is cut into thin sheets or wafers. Additional methods by which unsupported multicrystalline semiconducting materials are made include, for example, electromagnetic casting and ribbon growth techniques, which may be slow, producing about 1-2 cm/min for polycrystalline silicon ribbon growth technologies.

Supported semiconducting material sheets may be made less expensively, but the thin semiconducting material sheet may be limited by the substrate on which it is made, and the substrate may have to meet various process and application requirements, which may be conflicting.

Thus, there is a long-felt need in the industry for a method to make articles of semiconducting materials, which method would decrease the amount of impurities, decrease the amount of defects, improve crystal grain structure of the article of semiconducting material, reduce material waste, and/or increase the rate of production.

Useful methods for producing unsupported polycrystalline semiconducting materials are disclosed in commonly-owned U.S. Provisional Patent Application No. 61/067,679, filed Feb. 29, 2008, titled "METHOD OF MAKING AN UNSUPPORTED ARTICLE OF A PURE OR DOPED SEMICONDUCTING ELEMENT OR ALLOY," and International Patent Application No. PCT/US09/01268, filed Feb. 27, 2009, titled "METHOD OF MAKING AN UNSUPPORTED ARTICLE OF A PURE OR DOPED SEMICONDUCTING ELEMENT OR ALLOY," the disclosures of which are hereby incorporated by reference.

As described herein, the inventors have now discovered additional methods by which supported and unsupported articles of semiconducting materials may be made.

SUMMARY

In accordance with various exemplary embodiments of the invention are provided methods of making an article of semiconducting material on a mold comprising semiconducting material, such methods comprising providing a molten first semiconducting material at a bulk temperature $T_S$, providing a mold comprising a second semiconducting material at a temperature $T_{Mold}$, such that $T_S > T_{Mold}$, optionally coating an external surface of the mold with particles, immersing the mold in the molten first semiconducting material for a period of time sufficient to form a solid layer at least partially comprised of the first semiconducting material over an external surface of the mold, and withdrawing the mold with the solid layer from the molten first semiconducting material. In various embodiments, the methods may further comprise separating the solid layer from the mold to form an unsupported article of semiconducting material.

Other exemplary embodiments of the invention relate to methods of making an article of semiconducting material comprising providing a molten first semiconducting material at a bulk temperature $T_S$, providing a mold comprising a second semiconducting material at a temperature $T_{Mold}$, such that $T_S > T_{Mold}$, optionally coating an external surface of the mold with particles, immersing the mold in the molten first semiconducting material for a period of time sufficient to form a solid layer at least partially comprised of the first semiconducting material over an external surface of the mold, wherein the temperature of the mold is altered only by the temperature of the molten first semiconducting material, and withdrawing the mold with the solid layer from the molten first semiconducting material. In various embodiments, the methods may further comprise separating the solid layer from the mold to form an unsupported article of semiconducting material.

Other exemplary embodiments of the invention relate to methods of reducing impurities in an article of semiconducting material comprising providing a molten first semiconducting material at a bulk temperature $T_S$, providing a mold comprising a second semiconducting material at a temperature $T_{Mold}$, wherein $T_S > T_{Mold}$, optionally coating an external surface of the mold with particles, immersing the mold in the molten first semiconducting material for a period of time sufficient for a solid layer at least partially comprised of the first semiconducting material to form over an external surface of the mold such that the temperature of the mold is altered only by the temperature of the molten first semiconducting material, and withdrawing the mold with the solid layer from the molten first semiconducting material. In various embodiments, the methods may further comprise separating the solid layer from the mold to form an unsupported article of semiconducting material.

Exemplary embodiments of the invention also relate to articles of semiconducting material formed by any of the methods described herein.

Further exemplary embodiments of the invention relate to semiconducting-material molds for forming articles of semiconducting material, wherein the mold comprises an external surface and particles on the external surface.

The methods according to the present invention may, in at least some embodiments, improve crystal grain structure of the article of semiconducting material, reduce the amount of impurities and/or the amount of defects in the article of semiconducting material, reduce material waste, and/or increase the rate of production of the semiconducting material.

As used herein, the term "semiconducting material" includes materials that exhibit semiconducting properties, such as, for example, silicon, alloys and compounds of silicon, germanium, alloys and compounds of germanium, alloys and compounds of tin, gallium arsenide, alloys and compounds of gallium arsenide, and mixtures thereof. In various embodiments, the semiconducting material may be pure (such as, for example, intrinsic or i-type silicon) or doped (such as, for example, silicon containing at least one n-type or p-type dopant, such as phosphorous or boron, respectively).

As used herein, the phrase "article of semiconducting material" includes any shape or form of semiconducting material made using the methods of the present invention. Examples of such articles include articles that are smooth or textured; articles that are flat, curved, bent, or angled; and articles that are symmetric or asymmetric. Articles of semiconducting materials may comprise forms such as, for example, sheets or tubes.

As used herein, the term "unsupported" means that an article of semiconducting material is not integral with a mold. The unsupported article may be connected to the mold while it is being formed, but the article of semiconducting material is separated from the mold after it is formed over the mold. The unsupported article may, however, be subsequently applied on a substrate for various applications, such as photovoltaic applications.

As used herein, the term "supported" means that an article of semiconducting material is integral with a mold. The supported article may remain on the mold for further processing, after which the article of semiconducting material may or may not be removed from the mold, or the mold may act as a support or substrate for the article of semiconducting material.

As used herein, the term "mold" means a physical structure that can influence the final shape of the article of semiconducting material. Molten or solidified semiconducting material need not actually physically contact a surface of the mold in the methods described herein, although contact may occur between a surface of the mold and the molten or solidified semiconducting material. A "semiconducting-material mold" as used herein is meant to include any mold comprising a semiconducting material.

As used herein, the term "external surface of the mold" means a surface of the mold that may be exposed to a molten semiconducting material upon immersion. For example, an interior surface of a tube-shaped mold may be an external surface if the internal surface can contact a molten semiconducting material when the mold is immersed. Reference to "the external surface of the mold" means at least part of the external surface of the mold.

As used herein, the phrase "first semiconducting material" is used to identify the semiconducting material of the molten semiconducting material. Therefore, the phrase "molten semiconducting material" is used interchangeably with the phrase "molten first semiconducting material."

As used herein, the phrase "second semiconducting material" is used to identify the semiconducting material of the mold. Therefore, the phrase "a semiconducting-material mold" and variations thereof is used interchangeably with the phrase "a mold comprised of a second semiconducting material" and variations thereof. According to various embodiments, the first and second semiconducting materials may comprise substantially the same or different semiconducting materials. When the first and second semiconducting materials are substantially the same, at least one of the first and second semiconducting materials may further comprise at least one additional component, such as, for example, a dopant.

As used herein, the phrase "form a solid layer at least partially comprised of the first semiconducting material over an external surface of the mold" and variations thereof mean that at least some of the first semiconducting material from the molten semiconducting material solidifies (also referred to herein as freezing or crystallizing) on or near an external surface of the mold. The phrases "solid layer at least partially comprised of the first semiconducting material," "solid layer of semiconducting material," and "solid layer" are used interchangeably to identify the layer at least partially comprised of the first molten semiconducting material that solidifies over the external surface of the mold. The solid layer may, in various embodiments, also comprise the second semiconducting material, for example if the second semiconducting material partially melts in the molten first semiconducting material and then refreezes. In various other embodiments, the solid layer of semiconducting material may also comprise at least one dopant if at least one of the molten first semiconducting material and the second semiconducting material comprises at least one dopant.

Forming a solid layer of semiconducting material over an external surface of the mold may, in some embodiments, include solidifying semiconducting material on a layer of particles that coat the external surface of the mold. In various embodiments, due to the temperature difference between the mold and the molten semiconducting material, the semiconducting material may solidify before it physically contacts the surface of the mold. When the semiconducting material solidifies before it physically contacts the mold, the solidified semiconducting material may, in some embodiments, subsequently come into physical contact with the mold or with particles coating the mold. The semiconducting material may, in some embodiments, also solidify after physically contacting the external surface of the mold, or particles coating the surface of the mold, if present.

As used herein, the phrase "reduce the amount of impurities" and variations thereof include any reduction in the presence of impurities, which include any undesired materials or any materials other than dopants and the semiconducting material present in the formed semiconducting article with respect to conventional methods, such as, for example, methods using molds comprising silicon carbide.

As used herein, the phrase "reduce the amount of defects in the article of semiconducting material" and variations thereof include any reduction in the amount of defects present in the crystal structure of the article of semiconducting material, such as, for example, dislocations and grain boundaries, with respect to conventional methods for producing semiconducting material articles.

As used herein, the phrase "increased rate of production" and variations thereof include any increase in the rate of semiconducting material article production with respect to conventional methods for producing semiconducting material, such as ribbon growth methods. For example, an increased rate of production may be any rate greater than 1-2 cm/min.

As used herein, the phrase "reduced material waste" and variations thereof mean any reduction in the amount of semiconducting material lost through conventional methods using slicing or cutting following production of the article of semiconducting material.

As used herein, the term "crystalline" means any material comprising a crystal structure, including, for example, single crystalline and multicrystalline semiconducting materials.

As used herein, the term "multicrystalline" includes any material comprised of a plurality of crystal grains. For example, multicrystalline materials may include polycrystalline, microcrystalline, and nanocrystalline materials.

As used herein, the terms, "temperature of the molten semiconducting material," "bulk temperature of the molten semiconducting material," and variations thereof mean the average temperature of the molten semiconducting material contained within the vessel. Localized temperatures within the molten semiconducting material may vary spatially at any point in time, such as, for example, areas of the molten semiconducting material close to the mold when the mold is immersed, or molten semiconducting material exposed to the atmospheric conditions at the top surface of the vessel. In various embodiments, the average temperature of the molten semiconducting material is substantially uniform despite any localized temperature variation.

As described herein, the invention relates to methods of making articles of semiconducting material and semiconducting material articles formed thereby. In the following description, certain aspects and embodiments will become evident. It should be understood that the invention, in its broadest sense, could be practiced without having one or more features of these aspects and embodiments. It should be understood that these aspects and embodiments are merely exemplary and explanatory, and are not restrictive of the invention as claimed.

BRIEF DESCRIPTION OF DRAWINGS

The following figures, which are described below and which are incorporated in and constitute a part of the specification, illustrate exemplary embodiments of the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

DETAILED DESCRIPTION

It is to be understood that both the foregoing general description and the following detailed description are exemplary and explanatory only, and are not restrictive of the invention. Other embodiments of the invention will be apparent to those skilled in the art from consideration of the specification and practice of the invention disclosed herein.

Figure 1:
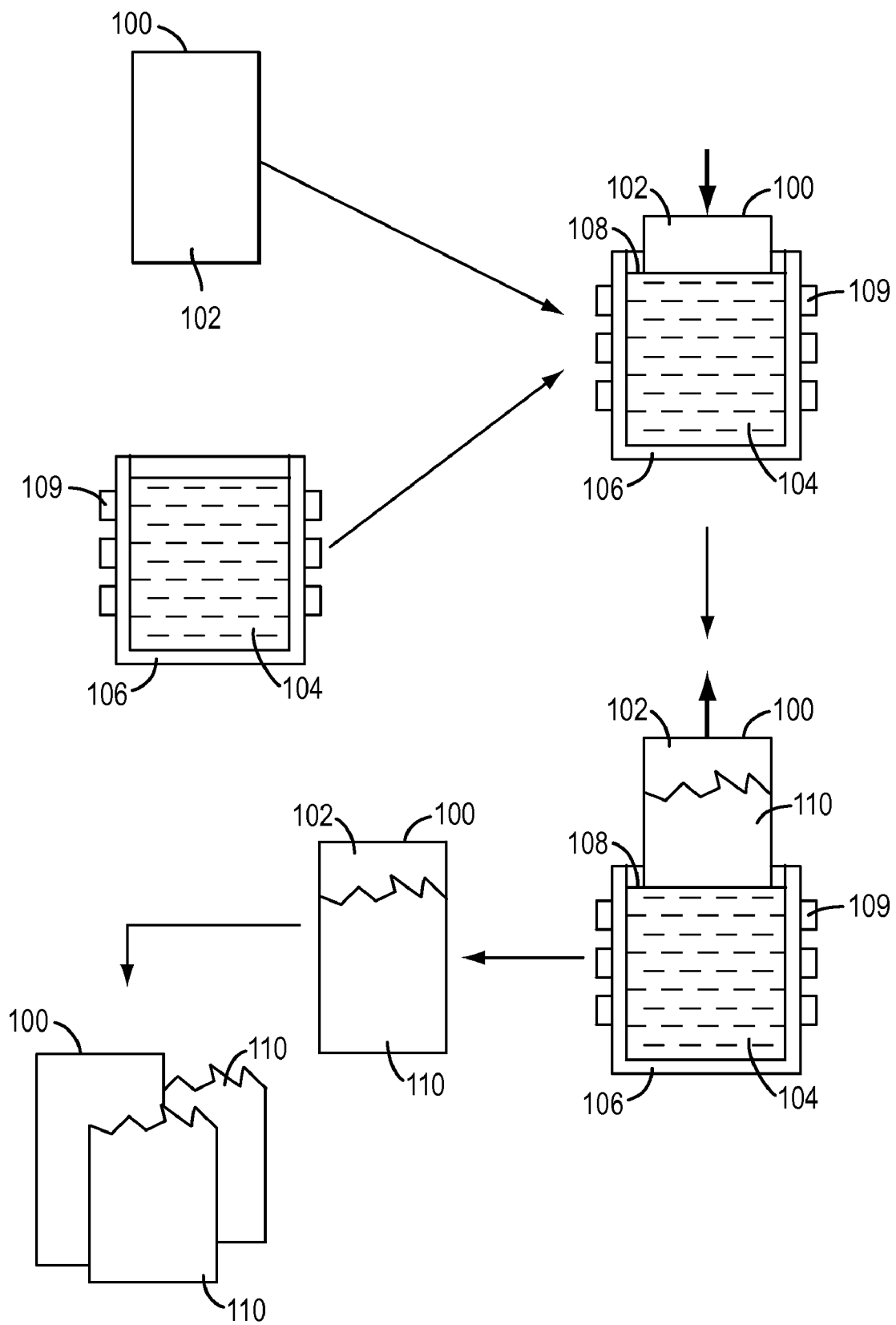
FIG. 1 is a schematic illustration of an exemplary method of making an unsupported article of semiconducting material according to an embodiment of the present invention.

FIG. 1 illustrates an exemplary method of making an unsupported article of a semiconducting material. A method similar to the exemplary method illustrated in FIG. 1 can be used to make a supported article, for example by stopping before the final separation step.

The exemplary method shown in FIG. 1 is an exocasting process, which casts an article on a surface, such as an external surface, of a mold, rather than filling a mold cavity. In the exemplary method shown in FIG. 1, mold 100 is provided having an external surface 102 with a desired size, surface area, shape, and surface texture/pattern. The surface area, shape, and surface texture/pattern of the external surface 102 of the mold 100 may determine the size, shape, and surface texture/pattern of the cast article. One of ordinary skill in the art would recognize that the size, shape, and surface texture/pattern of the external surface 102 of the mold 100 can be selected based on, for example, the desired properties and features of the cast article.

In at least one embodiment, mold 100 comprises a semiconducting material that is compatible with the molten semiconducting material 104. In at least one embodiment, mold 100 comprises the same material as molten semiconducting material 104. While not wishing to be bound by theory, it is believed that using a mold 100 made of the same material as molten semiconducting material 104, the amount of impurities in the formed semiconducting material article may be reduced. In at least one embodiment, mold 100 and molten semiconducting material 104 may comprise the same semiconducting material, wherein at least one of the mold 100 and molten semiconducting material 104 further comprises at least one additional material, such as, for example, a dopant. Mold 100 may, in various embodiments, comprise a material such that when mold 100 is heated via contact with the molten semiconducting material 104, mold 100 does not check, fracture, or explode due to, for example, large thermal stresses generated from uneven, rapid thermal expansion, or from trapped gases.

In at least one embodiment, mold 100 is made of a material chosen from silicon, alloys and compounds of silicon, germanium, alloys and compounds of germanium, gallium arsenide, alloys and compounds of gallium arsenide, alloys and compounds of tin, and mixtures thereof. According to various embodiments, mold 100 may be substantially pure semiconducting material or may further comprise at least one dopant, such as, for example, phosphorous, boron, or aluminum. For example, the semiconducting material comprising mold 100 may comprise less than 1 ppm of iron, manganese, and chromium, and/or less than 1 ppb of vanadium, titanium, and zirconium. The semiconducting-material mold 100 may also comprise less than $10^{15}$ atoms/cm$^3$ of nitrogen and/or less than $10^{17}$ atoms/cm$^3$ of carbon. In at least one embodiment, the source of the semiconducting material may be photovoltaic-grade or purer silicon. In various embodiments embodiment, mold 100 may comprise silicon, silicon alloys, and/or silicon mixtures, for example. Mold 100 according to various embodiments may also comprise layers of oxide. For example, in one embodiment a mold 100 made of silicon may comprise a thin layer of natural oxide. In other embodiments, the oxide may be removed prior to immersion in molten semiconducting material 104, such as, for example, by removing the oxide layer with hydrofluoric acid.

Mold 100 may comprise a monocrystalline or polycrystalline material. For example, mold 100 may comprise monocrystalline or polycrystalline silicon. By way of example, in at least one embodiment, mold 100 may comprise polycrystalline silicon. In a further exemplary embodiment, mold 100 comprises a polycrystalline material having a uniform grain size.

Molten semiconducting material 104 such as, for example, molten silicon, may in at least one embodiment be provided by melting silicon in a vessel 106, such as a crucible, which may optionally be non-reactive with the silicon. In at least one embodiment, molten semiconducting material 104 may have low contaminant levels. For example, molten semiconducting material 104 may comprise less than 1 ppm of iron, manganese, and chromium, and/or less than 1 ppb of vanadium, titanium, and zirconium. Molten semiconducting material 104 may also comprise less than $10^{15}$ atoms/cm$^3$ of nitrogen and/or less than $10^{17}$ atoms/cm$^3$ of carbon. In at least one embodiment, the source of the molten semiconducting material may be photovoltaic-grade or purer silicon.

In at least one embodiment, the molten semiconducting material 104 may be brought to a bulk temperature, $T_S$, optionally in a low oxygen or reducing atmosphere, using any suitable heating device or method. Examples of suitable heating devices and methods include heating elements, such as resistive or inductive heating elements, and a flame heat source. One skilled in the art would recognize that the choice of heating device or method may be made based on factors such as, for example, the capacity of the vessel containing the molten semiconducting material, the size/thickness of the vessel, and/or the atmosphere surrounding the vessel.

In one exemplary embodiment of the invention, mold 100 may be brought to a temperature, $T_{Mold}$, optionally in a low oxygen or reducing atmosphere, using any suitable heating device or method. As described above, suitable heating devices and methods include heating elements and a flame heat source, as well as infrared (IR) heat sources (e.g., IR lamps). In at least one embodiment, mold 100 is brought to a temperature, $T_{Mold}$, by preheating mold 100 above the molten semiconducting material 104. As described above, one skilled in the art would recognize that the choice of a heat source depends on several factors such as, for example, the environment in which the mold is heated, the material of the mold, the thickness of the mold, and/or the desired level of contaminants in the final article produced.

Prior to immersion, the temperature of the mold, $T_{Mold}$, may be less than the bulk temperature of the molten semiconducting material, $T_S$, to establish a temperature difference between the mold 100 and the molten semiconducting material 104 that may drive the process. In various embodiments, the bulk temperature of molten semiconducting material, $T_S$, may be the melting temperature of the semiconducting material, or may be a higher temperature. In one exemplary embodiment where the semiconducting material comprises silicon, the bulk temperature of the molten silicon, $T_S$, may range from 1414° C. to 1550° C., such as, for example, from 1450° C. to 1490° C., such as 1460° C.

In at least one embodiment, the temperature of the mold, $T_{Mold}$, may be chosen, for example, so that the mold 100 is able to cool the molten semiconducting material adjacent the surface of mold 100 to the solidifying/freezing point of the semiconducting material 104, and to remove sufficient heat from the semiconducting material 104 to freeze it. In at least one embodiment, the temperature of the mold, $T_{Mold}$, may be chosen based, at least in part, on the thickness of mold 100.

Figure 2:
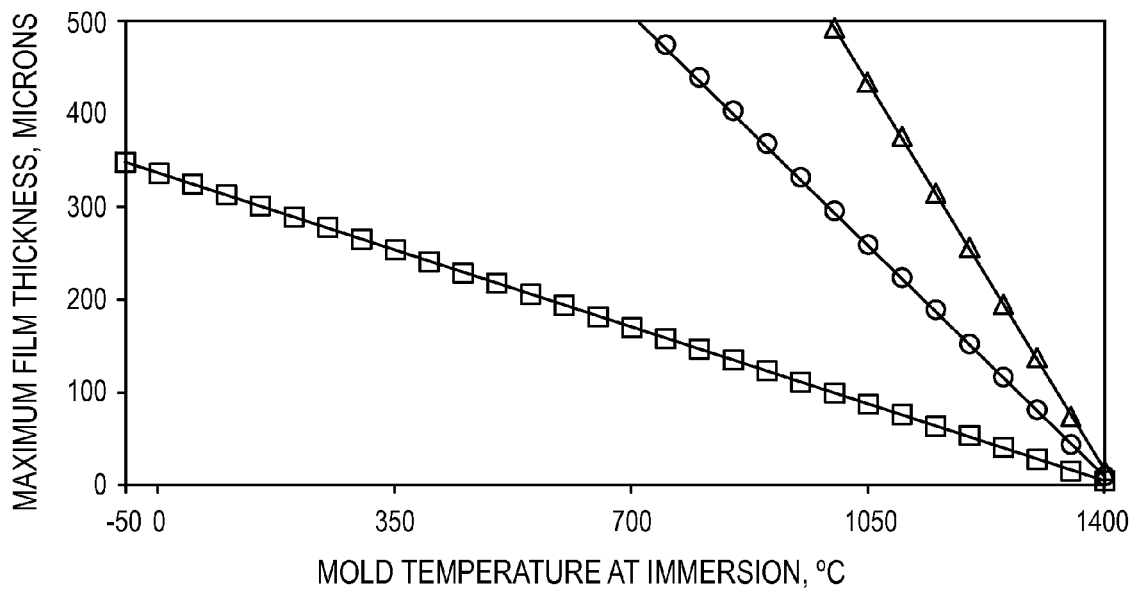
FIG. 2 is a graph illustrating the exemplary relationship between the mold temperature (in degrees Celsius) at the time of immersion (x-axis) and the maximum thickness (in microns) of a silicon film (y-axis) for various mold thicknesses according to an embodiment of the invention.

For example, as can be determined from the data presented in FIG. 2, a thicker mold may have the capacity to produce a thicker article of semiconducting material than a thinner mold when both molds have the same temperature at the time of immersion in the molten semiconducting material 104. In at least one embodiment, the temperature of the mold, $T_{Mold}$, may be selected such that mold 100 has sufficient thermal mass to prevent mold 100 from melting completely before any of the molten semiconducting material 104 freezes above the surface of the mold 100. By way of example, in various embodiments, mold 100 may have a thickness ranging from 300 µm to 3 mm, such as, for example, from 400 µm to 2 mm.

According to various embodiments, the temperature of the mold, $T_{Mold}$, may be selected to avoid large thermal stresses generated from uneven, rapid thermal expansion, or from trapped gases. For example, when mold 100 is made from silicon, mold 100 may be preheated to a temperature, $T_{Mold}$, of at least 350° C., such as from 350° C. to 1200° C., such as, from 400° C. to 700° C., prior to immersion in molten semiconducting material 104. The temperature of the mold 100 may increase as it is positioned near molten semiconducting material 104, or as mold 100 is immersed in molten semiconducting material 104. In at least one embodiment, the mold 100 is heated to a temperature, $T_{Mold}$, by holding the mold 100 above molten semiconducting material 104.

The determination of a suitable temperature of the mold, $T_{Mold}$, prior to immersion would be within the skill of the ordinary artisan, based on, for example, the temperature of the molten semiconducting material, $T_S$, the thickness of mold 100, the heat transfer and thermal properties of the molten semiconducting material 104 and mold 100, and the desired thickness of the formed article of semiconducting material.

Figure 5:
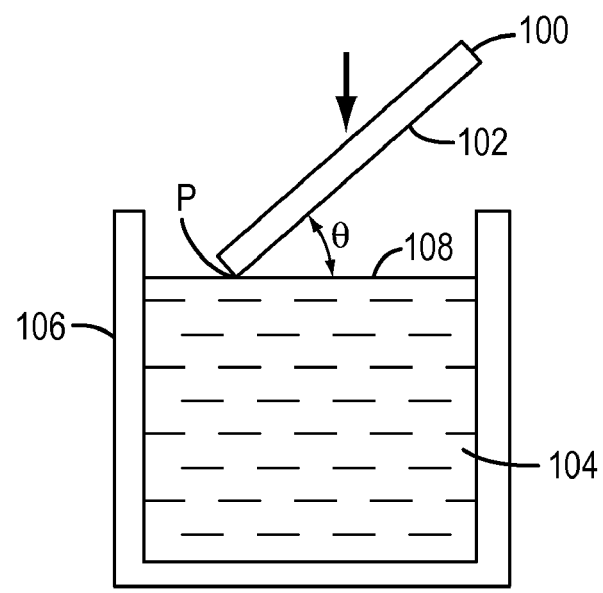
FIG. 5 is a schematic representation of an exemplary immersion angle of a mold as it is immersed in molten semiconducting material according to an embodiment of the invention.

According to at least one embodiment, as shown in FIG. 1, mold 100 may be immersed in the molten semiconducting material 104 at a predetermined rate, optionally in a low oxygen or reducing atmosphere. Mold 100 may be immersed in molten semiconducting material 104 at any immersion angle θ, where immersion angle θ is the angle between the surface 108 of molten semiconducting material 104 and the external surface 102 of mold 100 at the point P that first contacts the surface 108 of molten semiconducting material 104 as shown in FIG. 5. The angle at which external surface 102 of mold 100 contacts molten semiconducting material 104 may vary as mold 100 is immersed in molten semiconducting material 104. By way of example only, in one embodiment molten semiconducting material could contact a mold having a spherical external surface at an infinite number of angles as it is immersed, although the immersion angle θ would be 0° as the initial contact point would be parallel to the surface 108 of molten semiconducting material 104. In further exemplary embodiments, mold 100 may be moved in a direction parallel to surface 108 of molten semiconducting material 104 as mold 100 is immersed in a direction perpendicular to surface 108 of molten semiconducting material 104. One skilled in the art would also recognize that the local immersion angle, that is the immersion angle at any finite location at the point P of first contact may also vary due to the surface properties (such as, for example, porosity or height variations) and the wetting angle of the material comprising the mold.

In a further exemplary embodiment, external surface 102 of mold 100 may be substantially perpendicular to the surface 108 of the molten semiconducting material 104, i.e., the immersion angle is approximately 90°. In a further embodiment, the external surface 102 of mold 100 need not be perpendicular to the surface 108 of molten semiconducting material 104. By way of example, the external surface 102 of mold 100 may be immersed in the molten semiconducting material 104 at an immersion angle ranging from 0° to 180°, such as from 0° to 90°, from 0° to 30°, from 60° to 90°, or at an immersion angle of 45°.

In at least one embodiment of the present invention, immersion of the mold may be accomplished using any suitable technique, and may be accomplished by immersing the mold from above the molten semiconducting material or from the side or bottom of the molten semiconducting material.

In at least one embodiment, mold 100 may be immersed in the molten semiconducting material 104 for a period of time sufficient to allow a layer of the semiconducting material to sufficiently solidify on a surface 102 of mold 100. In at least one embodiment, the semiconducting material is sufficiently solidified when enough semiconducting material has solidified that the mold can be withdrawn from the molten semiconducting material and the layer of semiconducting material will be withdrawn with the mold. By way of example only, the mold 100 may be immersed in the molten semiconducting material 104 for up to 30 seconds or more depending on the thickness of mold 100. In at least one embodiment, the mold 100 may be immersed from 0.5 seconds to 30 seconds, such as up to 10 seconds. By way of example, mold 100 may be immersed in the molten semiconducting material 104 for 1 second to 4 seconds. The immersion time may be varied appropriately based on parameters known to those of skill in the art, such as, for example, the thickness of the mold, the temperatures and heat transfer and thermal properties of the mold and the molten semiconducting material, and the desired thickness of the formed article of semiconducting material. Thus, the appropriate immersion time could easily be determined by one skilled in the art.

In at least one embodiment, at least one heating element 109, such as resistive heating elements or inductive heating elements, may be used to heat the vessel 106 and hold the molten semiconducting material 104 at a desired temperature while mold 100 is immersed. In at least one embodiment, the temperature of the molten semiconducting material 104 may be maintained at the bulk temperature, $T_S$. The semiconducting material 104 can be melted and maintained in molten form by any desired method, and the selection of the heating method would be within the skill of one in the art based on the conditions and environment where the method is performed. In at least one embodiment of the present invention, a reducing environment radio frequency (RF) induction heating may be used. RF induction heating may provide a cleaner environment by minimizing the possibility of the presence of foreign matter in the melt. Induction can also provide the heat flux needed to maintain the desired bulk molten semiconducting material temperature as the material near the surface of mold 100 extracts heat rapidly.

According to at least one embodiment, mold 100 may be held essentially motionless in the plane parallel to the surface 108 of molten semiconducting material 104 as it is immersed in a direction perpendicular to surface 108 of molten semiconducting material 104. In other embodiments, mold 100 may be moved in the plane parallel to the surface 108 of molten semiconducting material 104, for example rotated or vibrated at any appropriate frequency, when it is immersed in a direction perpendicular to the surface 108 of molten semiconducting material 104. A layer of semiconducting material 110 may form over the surface 102 of mold 100. After immersion, mold 100 with a layer of semiconducting material 110 may be withdrawn from the vessel 106. In at least one embodiment, mold 100 with a layer of semiconducting material 110 may be cooled after it is removed from vessel 106, either actively such as by convective cooling, or by allowing the temperature of the layer of semiconducting material 110 to come to room temperature. After mold 100 is removed from vessel 106 and sufficiently cooled, the solid layer of semiconducting material 110 may be removed or separated from mold 100 by any method known to those of skill in the art. In at least one embodiment, the layer of semiconducting material may be sufficiently cooled when it may be separated or removed from the mold without breaking or deforming. In at least one embodiment, the layer of semiconducting material 110 may be separated or removed from mold 100 by differential expansion and/or mechanical assistance. In at least one embodiment, the solid layer of semiconducting material 110 may remain on mold 100 as a supported article of semiconducting material.

In at least one embodiment, the first and second semiconducting materials may be chosen from silicon, alloys and compounds of silicon, germanium, alloys and compounds of germanium, alloys and compounds of tin, gallium arsenide, alloys and compounds of gallium arsenide, and mixtures thereof. According to various embodiments, the first and/or second semiconducting material may be pure or doped. In at least one embodiment of the invention, the first and/or second semiconducting material comprises at least one dopant chosen from boron, phosphorous, or aluminum (B, P, or Al). In at least one embodiment, the at least one dopant is present in the part per million (ppm) range. The amount of dopant present in the first and/or second semiconducting material may be chosen based on the desired dopant concentration in the produced article of semiconducting material, and may depend on the final use of the article, such as, for example, a photovoltaic cell. According to at least one embodiment, an article of semiconducting material produced by the methods disclosed herein may comprise at least one dopant dispersed substantially homogeneously throughout the semiconducting material (e.g., without substantial segregation of the at least one dopant within the semiconducting material).

In a further embodiment, the first and/or second semiconducting material may comprise at least one non-semiconducting element that may form a semiconducting alloy or compound with another element. For example, the first and/or second semiconducting material may be chosen from gallium arsenide (GaAs), aluminum nitride (AlN), and indium phosphide (InP).

In various embodiments of the present invention, a number of process parameters may be varied, including but not limited to: (1) the composition, density, heat capacity, thermal conductivity, thermal diffusivity and thickness of the mold 100, (2) the temperature of the mold, $T_{Mold}$, at which it is provided prior to immersion and the bulk temperature of the molten semiconducting material, $T_S$, (3) the rate at which mold 100 is immersed into the molten semiconducting material 104, (4) the length of time which mold 100 is immersed in the molten semiconducting material 104, (5) the rate at which mold 100 having the solid layer of semiconducting material 110 is removed from the molten semiconducting material 104, and (6) the rate of cooling of the solidified semiconducting material 110.

In at least one embodiment, the temperature of the mold, $T_{Mold}$, at which it is provided prior to immersion, and the bulk temperature of the molten semiconducting material, $T_S$, are the only temperature parameters that are controlled (e.g., the temperature of the mold changes upon immersion in the molten semiconducting material while the temperature of the bulk molten semiconducting material is maintained at a constant temperature).

In at least one embodiment of the present invention, the temperature of mold 100 is not controlled after it is immersed in the molten semiconducting material 104, and thus the temperature is only altered by the temperature of the molten semiconducting material, $T_S$. The temperature of the molten semiconducting material, $T_S$, may alter the temperature of mold 100 through radiation, convection, or conduction. Radiative heating of mold 100 may occur, for example, when mold 100 is above molten semiconducting material 104. Mold 100 may be convectively heated by molten semiconducting material 104 when fumes above molten semiconducting material 104 pass over the surface of mold 100 or during immersion of mold 100 in the molten semiconducting material 104. Heating of mold 100 by conduction may occur, for example, while mold 100 is immersed in molten semiconducting material 104.

Mold 100 may be in any form suitable for use in the disclosed methods. For example, in at least one embodiment, mold 100 may be in the form of a monolith or in the form of a laminated structure such as a laminated monolith. Mold 100 may comprise a porous or non-porous body, optionally with at least one porous or non-porous coating. According to at least one embodiment, mold 100 may comprise at least one porous or non-porous coating of a semiconducting material. In at least one embodiment, mold 100 may also comprise a uniform or non-uniform composition, uniform or non-uniform porosity, or other uniform or non-uniform structural characteristic throughout the mold body. In embodiments where mold 100 is laminated or has a non-uniform composition, the external surfaces of the mold 100 may comprise semiconducting material, which may reduce the amount of impurities and/or reduce the amount of defects present in the formed article of semiconducting material.

Mold 100 may comprise one or more polished or smooth external surfaces, or the external surfaces of the mold may be uniformly or non-uniformly textured, such as, for example, a rough cut surface after sawing or by patterning the surface, such as, for example, with a honeycomb pattern. According to at least one embodiment, mold 100 may also be in any shape suitable for use in the disclosed method. For example, mold 100 may comprise one or more flat surfaces or one or more curved surfaces, for example one or more convex or concave surfaces. For example, the one or more flat surfaces may be used to create an article in the shape of a rectangle, and the one or more convex or concave surfaces may be used to create an article in the shape of a lens or a tube.

In at least one embodiment, the thermophysical properties of the material of mold 100 and the thickness of mold 100 may combine to determine the capacity of mold 100 to extract heat from the molten semiconducting material 104 in contact with the external surface 102 of mold 100 causing the semiconducting material to solidify, as well as the rate at which the heat may be transferred. Without wishing to be limited by theory, it is believed that the rate at which heat is extracted from the solid layer 110 over the external surface 102 of mold 100 may affect the grain size of the solid semiconducting material layer 110. The temperature difference between mold 100 and molten semiconducting material 104 may provide a driving force for the liquid-to-solid phase transformation, while the heat transfer properties (conductivity and diffusivity) of mold 100 may set the rate at which the heat can be removed. A larger temperature difference may, in general, provide a larger driving force, which may result in a finer grained material as more energy may be available to surmount the nucleation barrier at a greater number of sites. A smaller temperature difference may favor larger grains.

FIG. 2 shows an graphical representation of an exemplary theoretical calculation illustrating the maximum thickness of a solidified silicon layer that may be achieved as a function of the mold temperature, $T_{Mold}$, at the time of immersion corresponding to mold thicknesses of 1 mm, 3 mm and 5 mm, as illustrated by squares, circles, and triangles, respectively. The graphs shown in FIG. 2 are generated by solving the energy balance equation below for the given mold material's physical properties. The maximum thickness of solidified silicon layer, $\Delta$, formed while the mold is immersed in the molten semiconducting material can be expressed as a function (EQ. 1) of the mold density, $\rho_{Mold}$, the mold heat capacity, $Cp_{Mold}$, the temperature of the mold, $T_{Mold}$, at the time of immersion, the silicon melting temperature, $T_M$, the bulk temperature of the molten silicon, $T_S$, the thickness of the mold, W, the molten silicon density, $\rho_{Si}$, the specific heat capacity of molten silicon, $Cp_{Si}$, and the latent fusion heat of silicon, $\lambda_{Si}$:

$$\Delta = \frac{1}{2}\left[\frac{\rho_{Mold} Cp_{Mold} W (T_M - T_{Mold})}{\rho_{Si}\lambda_{Si} + \rho_{Si} Cp_{Si}(T_S - T_M)}\right] \quad \text{(EQ. 1)}$$

Figure 4:
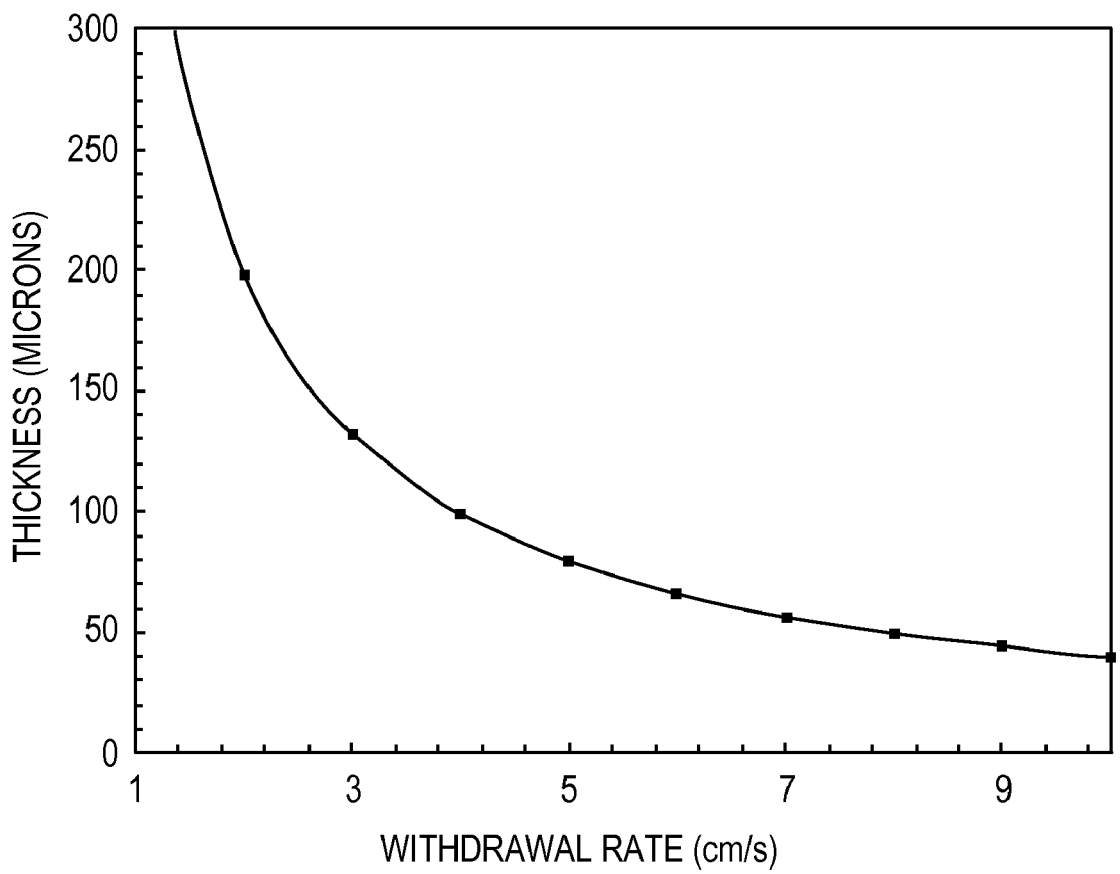
FIG. 4 is a graph illustrating the exemplary thickness (in microns) of a drag layer of molten semiconducting material (y-axis) as a function of the rate (in cm/s) at which the mold is withdrawn from the molten semiconducting material (x-axis) according to an embodiment of the invention.

In addition to the thickness of semiconducting material contributed by the freezing/remelting of the semiconducting material over a surface of the mold, the thickness of the formed article of semiconducting material may also be affected by a drag layer that is formed when the mold 100 is withdrawn from the molten semiconducting material 104. Without wishing to be bound by theory, it is believed that the thickness added by the drag layer can be attributed to a combination of conventional dip-coating dynamics and additional freezing of the semiconducting material, which may depend on the rate at which mold 100 is withdrawn from molten semiconducting material 104. Molten semiconducting material may wet the solid layer 110 of semiconducting material formed over the mold 100 as it is withdrawn from molten semiconducting material 104, forming a drag layer of the molten semiconducting material. The drag layer of the molten semiconducting material may freeze on the already solidified layer of semiconducting material and thus may add to the thickness of the final article. The thickness contributed by the drag layer may depend on how much of the molten semiconducting material is dragged and how much of the dragged layer actually freezes. If heat transfer is limiting the frozen drag layer thickness, increasing the rate of removal will decrease the frozen drag layer due to molten semiconducting material dragging. Conversely, if the dragged molten semiconducting material is limited, increasing the rate of removal will increase the frozen drag layer. The theoretical thickness of the drag layer contributed by a conventional dip-coating process may be approximated using the Landau-Levich equation (EQ. 2):

$$H = 0.944 \ast (\mu U/\sigma)^{1/6} \ast (\mu U/\rho g)^{1/2} \quad \text{(EQ. 2)}$$

where H is the thickness of the dip-coated layer, $\mu$ is the liquid viscosity (e.g., the molten semiconducting material), U is the velocity of the mold as it is removed, $\sigma$ is the surface tension of the liquid, $\rho$ is the density of the liquid, and g is acceleration due to gravity. The contribution of the additional thickness due to freezing may be a function of the length of the mold divided by the withdrawal rate of the mold from the molten semiconducting material. Thus, the thickness of the drag layer may decrease as the withdrawal rate is increased, as shown in FIG. 4. By way of example, in one embodiment where the mold is withdrawn at a rate ranging from 2 cm/s to 5 cm/s, the drag layer may contribute 100 μm to the thickness of the formed semiconducting material article.

Figure 3:
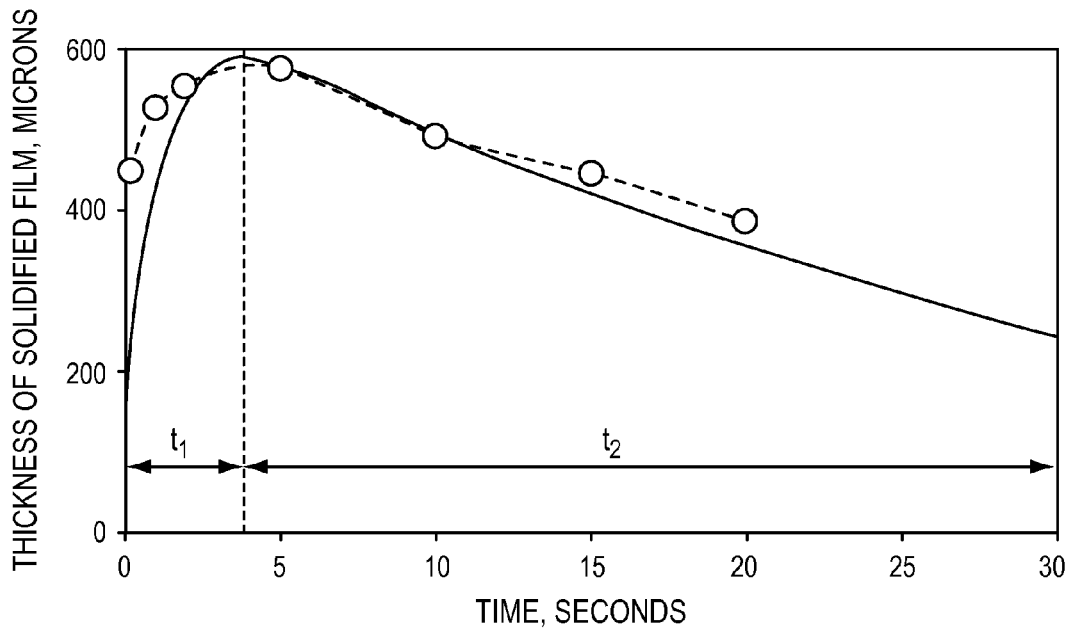
FIG. 3 is a graph illustrating the exemplary relationship between a thickness (in microns) of a solid silicon layer formed on a mold (y-axis) and the immersion time (in seconds) of the mold in molten silicon (x-axis) according to an embodiment of the invention.

In at least one embodiment of the present invention, the thickness of the resulting solid layer may be controlled by altering the immersion time of mold 100 in the molten semiconducting material 104. FIG. 3 shows an exemplary calculated graph of solidification distance (solid line), measured from the external surface 102 of mold 100, as a function of immersion time. FIG. 3 also shows a set of experimental data (dotted line with circles) corresponding to the processing conditions of the calculation. In at least some embodiments of the processes described herein, the solidified layer (e.g., silicon) initially rapidly grows to a maximum possible thickness, shown during time period $t_1$. The solidified layer may then thin during time period $t_2$ as the solid semiconducting material remelts back into the bulk molten semiconducting material, which may be maintained at a predetermined temperature. Without wishing to be limited by theory, it is believed that during the initial phase, solidification is initiated at the mold-liquid interface followed by the progression of the solidification front into the liquid (i.e., the molten semiconducting material), thereby leading to growth of a frozen layer of finite thickness. In the latter phase of the process, it is believed that remelting of the frozen layer takes place and the solid-liquid interface recedes towards the substrate wall. If the mold were left in the molten semiconducting material, all of the initially frozen layer would remelt as the mold thermally equilibrates with the melt. The instantaneous velocity of the solid-liquid interface is given by the Stephan condition (EQ. 3):

$$K_S \frac{\partial T}{\partial x}\bigg|_S - K_L \frac{\partial T}{\partial x}\bigg|_L = v_i \rho_S \lambda \quad \text{(EQ. 3)}$$

where $K_S$ and $K_L$ are the thermal conductivities of the liquid and solid phase, $v_i$ is the instantaneous interface velocity, $\rho_S$ is the density of the solid phase and $\lambda$ the latent heat of fusion. The first and second terms on the left side of the equation are the heat fluxes through the solid and the liquid, respectively. If the heat flux through the solid is larger than the heat flux through the liquid, then the interface velocity is positive and the freezing continues. If the heat flux through the liquid is higher than the heat flux thorough the solid, the interface velocity is negative and remelting takes place. In at least one embodiment of the present invention, the thickness of the article of semiconducting material is controlled by immersing the mold in the molten semiconducting material for a period of time such that the heat flux through the molten semiconducting material is higher than the heat flux through the solidified semiconducting material and remelting takes place. As can be determined from the data presented in FIG. 3, the rate at which remelting takes place is slower than the rate of the initial formation of the solid semiconducting material layer. It is believed that because of the slower rate of change in the thickness, the thickness of the formed article can be more accurately controlled during the remelting phase.

When the mold is immersed in the molten semiconducting material, during the solidifying phase, the heat flux through the solid phase (the first term on left hand side of the equation) is much larger than that in the initially isothermal liquid, and therefore rapid solidification into the liquid takes place. After a certain length of time, the heat flux through the liquid is higher than that through the solid, and remelting takes place. After a sufficient period of time has elapsed, the entire solidified layer of semiconducting material remelts and the mold thermally equilibrates with the melt.

It is believed that, in at least certain embodiments, the solidification phase starts at the mold-liquid interface, followed by the progression of solidification into the liquid from the mold. The dynamics of this process may be controlled by the rate of latent heat generation at the solidification interface and its conduction away from the interface. For solidification into a super-heated melt (i.e., where the temperature of the melt is greater than the melting point of the material), the temperature gradient ahead of the interface (i.e., in the direction of the melt) is expected to be positive. Therefore, the latent heat released at the solidifying/freezing front cannot be conducted or convected away into the melt. It is believed that the solidification dynamics are therefore set by the conduction of latent heat through the solidified semiconducting material into the mold (e.g., silicon). The faster the conduction through the solidified semiconducting material and the mold, the faster is the solidification rate. Consequently, it is believed that the thermal properties of the mold have significant effect on the solidification dynamics. Conversely, it is believed that the temperature of the molten semiconducting material does not have much effect on the solidification phase. The solidification continues until the heat fluxes through the liquid (i.e., the molten semiconducting material) and the solid semiconducting material layer become equal. Beyond this point, the flux through the liquid is higher than that through the solid semiconducting material and remelting starts. During the remelting phase, latent heat is supplied to the interface from the superheated molten semiconducting material. Therefore, during the remelting phase, the properties of the molten semiconducting material have a greater effect on the remelting dynamics and the thermal properties of the mold do not have much effect.

In at least some embodiments of the invention, it is believed that immediately after immersion the primary solid semiconducting material layer, e.g., a silicon layer that solidified during immersion, is growing substantially parallel to a surface of the mold as heat is transferred from the molten silicon to the mold. After the initial substantially-parallel growth, it is believed that growth of the silicon layer proceeds substantially normal to a surface of the mold. The solid semiconducting material layer may grow until the heat flux across the solid-liquid interface is equal, then melt back into the molten semiconducting material.

According to at least one embodiment, the rate at which the mold 100 is immersed into the molten semiconducting material 104 may range from 1.0 cm/s to 50 cm/s, such as, for example, from 3 cm/s to 10 cm/s. One skilled in the art would recognize that the immersion rate may vary depending on various parameters, such as, for example, the semiconducting material composition (including optional dopants), the size/shape of the mold, and the surface texture of the mold.

The rate at which the mold 100 is withdrawn from the molten semiconducting material 104 after immersion may also have an effect on the structure of the formed solid article. For example, slower withdrawal rates may result in smoother formed articles than faster withdrawal rates. In at least one embodiment, solid articles having smoother surfaces can be made using a relatively slow withdrawal rate of the mold from the molten semiconducting material, such as, for example, 2 to 5 cm/s. When the mold is withdrawn too quickly, small local variations in heat removal may manifest as isolated solidification events that trap extra liquid within them, forming puddles and bumps. As these puddles and bumps rapidly solidify, they may form blobs and faceted peaks, sometimes several millimeters tall and up to one centimeter wide. It is believed that slower withdrawal confines the wetted area to the liquid-solid-gas interface and puts a continuous secondary smooth layer on the surface of the solid layer. Furthermore, quickly moving the mold may induce flow patterns and even turbulence in the melt. The coupling between flow motion and heat transfer may cause pattern formation on the solidified surface of the article. In at least one embodiment, an article of semiconducting material is made by withdrawing the mold at a rate such that a secondary smooth layer is formed on the surface of the solid semiconducting material layer.

A person skilled in the art would recognize that the immersion rate, immersion time, and withdrawal rate may all affect the produced article and that those parameters may be chosen based on the desired article, the material/shape/texture/size of the mold, the starting temperature of the mold, the temperature of the molten semiconducting material, and the properties of the semiconducting material.

Returning to FIG. 1, in at least one embodiment vessel 106, which holds the molten semiconducting material 104, may not react with the molten semiconducting material 104 and/or may not contaminate the molten semiconducting material 104. In at least one embodiment, vessel 106 may be made from a material chosen from vitreous silica, graphite, and silicon nitride. In at least one embodiment, vessel 106 is made of vitreous silica.

Without wishing to be limited, it is believed that in at least certain embodiments, the use of vitreous silica for vessel 106 may lead to oxygen contamination of the semiconducting material. Thus, in various embodiments, oxygen contamination may optionally be mitigated or substantially mitigated, such as by melting the semiconducting material and casting the article in a low-oxygen environment, such as, for example, a dry mixture of hydrogen (<1 ppm of water) and an inert gas such as argon, krypton or xenon. In at least one exemplary embodiment, the atmosphere may be chosen from an Ar/1.0 wt % $H_2$ mixture or Ar/2.5 wt % $H_2$ mixture.

According to at least one embodiment of the present invention, mold 100 may be coated with particles, for example prior to being immersed or as mold 100 is immersed in the molten semiconducting material 104. It is believed that, in certain embodiments, a coating of particles may prevent the cast articles from sticking to mold 100, and may allow the crystals of the semiconducting material to grow uninterrupted, thereby resulting in larger grain size. The coating of particles may be continuous or discontinuous, uniform or non-uniform, and/or contiguous or non-contiguous. In at least one embodiment, mold 100 may be coated with particles, for example inorganic particles. In at least one embodiment, the particles may be of high purity. According to at least one embodiment, the particles have an average size ranging from 10 nm to 2 µm. In at least one embodiment, the particles are nanoparticles having an average size of 100 nm or less, such as, for example, 30 nm or less. The particles may comprise any material suitable for use in the disclosed method. For example, in at least one embodiment, the particles may comprise silicon, alloys and compounds of silicon (for example, silicon dioxide, silicon nitride), aluminum oxides, compounds of aluminum oxide, and/or glassy or crystalline compounds comprising aluminum and/or silicon, such as, for example, aluminum silicates, germanium, alloys and compounds of germanium, gallium arsenide, alloys and compounds of gallium arsenide, tin, alloys and compounds of tin, and mixtures thereof.

In at least one exemplary embodiment, a coating of particles (for example, silicon nanoparticles) may be formed on mold 100 as the mold 100 is situated above the molten semiconducting material (for example, silicon). In one exemplary embodiment, a condensation process, whereby fumes from the molten semiconducting material condense on the relatively cold external surface 102 of mold 100, may form a coating of nanoparticles on the surface of mold 100 ("fume coating"). For example, molten silicon may generate nanoparticulate-laden fumes when heated above the melting temperature of silicon, for example in a range from 1450° C. to 1550° C. In at least one embodiment, mold 100 is exposed to the fumes above molten semiconducting material 104 for a suitable length of time, such as, for example, 10 seconds to 30 seconds, with mold 100 at a suitable initial starting temperature, such as 100° C. In at least one embodiment, fumes from molten semiconducting material 104 may combine or react with the atmosphere above molten semiconducting material 104. For example, particles deposited on a surface of mold 100 over molten silicon may comprise silicon (Si) and silicon oxides (SiO and $SiO_2$).

In a further exemplary embodiment, particles may be deposited on mold 100 as mold 100 is immersed in molten semiconducting material 104. In yet a further exemplary embodiment, particles may be deposited on mold 100 before mold 100 is immersed and also as mold 100 is being immersed in molten semiconducting material 104.

In at least one embodiment, the coating on the mold 100 may be of sufficient thickness and coverage to aid the release of the article 110 from mold 100 to form an unsupported article. By way of example only, a fume coating having a coverage of greater than 60% and a coating thickness ranging from 100 nm to 5 µm may be formed on the mold. In a further embodiment, a fume coating having a coverage of greater than 80% may be formed on the mold. In some embodiments, the coating may form a substantially contiguous coating of grouped or clustered particles. The coating may, in various embodiments, have discontinuities where the surface of mold 100 is exposed. The grouped or clustered particles may, in some embodiments, form a porous-like surface.

In various exemplary embodiments, particles deposited or applied on the mold 100 may have the same or substantially the same composition as molten semiconducting material 104. In other embodiments, the particles may comprise alloys and compounds that may be derived from molten semiconducting material, such as, for example, silicon oxide. By way of example, in at least one embodiment, measures may be taken to ensure that the particles applied on the mold by the condensation process described are pure or substantially pure. According to at least one embodiment, the condensation process may be carried out in an enclosure having a highly reducing or low oxygen atmosphere, such as, for example, a dry mixture of pure argon with 2.5% hydrogen. In one embodiment, the atmosphere in the enclosure may optionally be scrubbed (e.g., continuously) of water, for example to levels below 1 ppm, and of oxygen, for example to levels below 5 ppm. The enclosure may optionally be slightly pressurized, for example to prevent ingress of atmospheric nitrogen. In at least one embodiment, low volatility carbon compounds may also be kept out of the enclosure.

In at least one further embodiment, rather than placing mold 100 in a fume generated by the molten semiconducting material 104, any non-contaminating surface (such as silicon), that is relatively cold may be held in the fume to collect the particles. The particles may then be applied onto the surface of mold 100 in a separate process. In at least one embodiment, a suspension of particles may be prepared and applied onto the surface of mold 100 using methods such as dip-coating, rubbing, brushing, spraying, and pouring. In other embodiments, the particles may be applied by methods such as chemical vapor deposition (CVD), physical vapor deposition (PVD), plasma-enhanced chemical vapor deposition (PECVD), or induction plasma deposition. In at least one embodiment, mold 100 may be coated with particles from any suitable source.

Without wishing to be bound by any theory, it is hypothesized that when a mold 100 coated with particles is immersed in the molten semiconducting material 104, the particles on the mold 100 form a physical barrier between the mold 100 and the molten semiconducting material 104 during the initial freezing event. It is believed that the particles then grow together to form a thin, weak, porous layer between the mold 100 and the solidified layer 110 during the remainder of the time the mold is immersed in the molten semiconducting material 104. During cooling of the mold 100 and solid layer 110, thermal mechanical stresses build up between the solid layer 110 and the mold 100 due to the difference in thermal expansion between the solid layer 110 and the mold 100. The porous layer of particles between the solid layer 110 and mold 100 then fractures, allowing the solid layer 110 to be removed more easily from the mold 100.

In at least one embodiment, the disclosed method may be used to make a sheet of semiconducting material, such as, for example, a silicon sheet, having a surface area, geometry, thickness, and grain structure within the range of usefulness for photovoltaic applications, for example a size up to approximately 156 mm×156 mm, thickness in a range of 100 μm to 400 μm, and a substantial number of grains larger than 1 mm. According to one embodiment, at least 60% of the grains may be larger than 1 mm. In a further embodiment, at least 80% or at least 90% of the grains may be larger than 1mm. In at least one embodiment, the grains are two to three times greater in size in their narrowest lateral direction than they are thick.

In at least one embodiment, the disclosed methods yield articles of semiconducting material at an improved rate and/or having a reduction in wasted material. For example, the exocasting processes described herein can be performed with essentially no waste of semiconducting elements, since all the melted material can be cast into a useful article. Any broken pieces or other unused material can be remelted and cast again. In at least one embodiment, immersion cycle times (i.e., the sum of time to immerse the mold, the immersion time, and the time to withdraw the mold) of less than 5 seconds are used to form sheets 7 cm in length (independent of width), which translates to a process speed of a few centimeters per second. In further embodiments, the disclosed methods yield articles of semiconducting material that have reduced amounts of impurities.

Unless otherwise indicated, all numbers used in the specification and claims are to be understood as being modified in all instances by the term "about," whether or not so stated. It should also be understood that the precise numerical values used in the specification and claims form additional embodiments of the invention. Efforts have been made to ensure the accuracy of the numerical values disclosed herein. Any measured numerical value, however, can inherently contain certain errors resulting from the standard deviation found in its respective measuring technique.

It is noted that, as used in this specification and the appended claims, the singular forms "a," "an," and "the," include plural referents unless expressly and unequivocally limited to one referent, and vice versa. Thus, by way of example only, reference to "a heat source" can refer to one or more heat sources, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

We claim:

1. A method of making an article of a semiconducting material, comprising:
providing a molten first semiconducting material at a temperature $T_S$;
providing a mold at a temperature $T_{Mold}$, such that $T_S > T_{Mold}$, wherein the mold comprises a second semiconducting material;
coating opposing external surfaces of the mold with particles;
immersing the mold in the molten first semiconducting material for a period of time sufficient to form solid layers at least partially comprised of the first semiconducting material over the external surfaces of the mold;
withdrawing the mold with the solid layers from the molten first semiconducting material; and
optionally separating the solid layers from the mold.

2. The method of claim 1, wherein the molten first semiconducting material and/or the second semiconducting material is selected from the group consisting of silicon, alloys and compounds of silicon, germanium, alloys and compounds of germanium, gallium arsenide, alloys and compounds of gallium arsenide, alloys and compounds of tin, and mixtures thereof.

3. The method of claim 1, wherein the molten first semiconducting material and the second semiconducting material comprise substantially the same semiconducting material.

4. The method of claim 1, wherein at least one of the molten first semiconducting material and the second semiconducting material further comprise at least one dopant.

5. The method of claim 1, wherein coating the external surfaces of the mold with particles comprises exposing the mold to fumes above the molten first semiconducting material for a period of time sufficient to form particles generated by the molten first semiconducting material on the external surfaces of the mold.

6. The method of claim 5, wherein the mold is situated above the molten first semiconducting material and exposed to fumes of the molten first semiconducting material before the mold is immersed in the molten first semiconducting material, and/or is exposed to fumes of the molten first semiconducting material as the mold is immersed in the molten first semiconducting material.

7. The method of claim 1, wherein coating the external surfaces of the mold with particles comprises spraying, rubbing, brushing, pouring, dip-coating, chemical vapor deposition, physical vapor deposition, plasma enhanced chemical vapor deposition, or plasma induction deposition of the particles on the external surfaces of the mold.

8. The method of claim 1, wherein the particles coating the external surfaces of the mold form a substantially contiguous coating of particles.

9. The method of claim 1, wherein the particles comprise a material that is selected from the group consisting of silicon, alloys and compounds of silicon, germanium, alloys and compounds of germanium, gallium arsenide, alloys and compounds of gallium arsenide, tin, alloys and compounds of tin, and mixtures thereof.

10. The method of claim 1, wherein providing the mold at a temperature $T_{Mold}$ comprises a step of heating the mold above the molten first semiconducting material.

11. The method of claim 1, wherein an atmosphere above the molten first semiconducting material comprises argon and hydrogen.

12. The method of claim 1, wherein the mold is immersed in the molten first semiconducting material at an immersion angle ranging from 0° to 180°.

13. The method of claim 1, wherein the mold is immersed in the molten first semiconducting material at an immersion angle of about 90°.

* * * * *